United States Patent [19]

Ferguson, Jr. et al.

[11] Patent Number: 5,789,974
[45] Date of Patent: Aug. 4, 1998

[54] CALIBRATING THE DC-OFFSET OF AMPLIFIERS

[75] Inventors: Paul F. Ferguson, Jr., Dracut; Gangadhar Burra, Acton; Michael Mueck, Andover, all of Mass.

[73] Assignee: Analog Devices, Inc., Norwood, Mass.

[21] Appl. No.: 682,102

[22] Filed: Jul. 17, 1996

[51] Int. Cl.$^6$ ...................................................... H03F 1/02
[52] U.S. Cl. ............................................. 330/2; 330/9
[58] Field of Search ............................. 330/2, 9, 51, 253, 330/257

[56] References Cited

U.S. PATENT DOCUMENTS

| 5,061,900 | 10/1991 | Vinn et al. ........................ 330/9 |
| 5,087,914 | 2/1992 | Sooch et al. ..................... 341/120 |
| 5,381,148 | 1/1995 | Mueck et al. .................... 341/139 |
| 5,397,944 | 3/1995 | DuPuis ............................ 327/307 |

OTHER PUBLICATIONS

Yu and Geiger, An Automatic Compensation Scheme with Ping–Pong Control of CMOS Operational Amplifiers, May, 1994 Jrnl. of Solid State Circuits, vol. 29, pp. 601–610.

Primary Examiner—Steven Mottola
Attorney, Agent, or Firm—Wolf, Greenfield & Sacks, P.C.

[57] ABSTRACT

The dc-offset voltage of an amplifier is calibrated by: (1) configuring the amplifier as a comparator, (2) using the output of the comparator to drive the up/down select input of an up/down counter, and (3) using the output count of the up/down counter to control: (a) a dc-offset correction voltage being: (i) applied across the inputs of the amplifier, or (ii) being used to adjust a voltage which controls an operating parameter of a device in the amplifier, or (b) switches which selectively adjust the effective size or operating conditions of a transistor or other device such that the dc-offset voltage of the amplifier is adjusted corresponding to the value of the output count. At the end of a calibration cycle, the output count of the up/down counter is maintained and is used to: (a) control a voltage which is applied permanently in series with one of the inputs of the amplifier or to an operating parameter control lead of a device in the amplifier, or (b) maintain the position of switches used to adjust the effective size or operating conditions of the transistor or other device in the amplifier to compensate for the offset voltage thereof.

25 Claims, 9 Drawing Sheets

CALIBRATING THE DC-OFFSET OF AMPLIFIERS

FIELD OF THE INVENTION

The present invention relates generally to electronic amplifiers and, more particularly, to methods and circuity for calibrating the dc-offset voltage of an amplifier.

BACKGROUND OF THE INVENTION

Operational amplifiers (op-amps) commonly are used to attenuate, amplify, filter or otherwise condition electronic signals (e.g., audio signals) prior to transmitting the signals to output devices (e.g., audio reproduction devices such as speakers). Typically, low-impedance speakers, e.g., eight ohms, are used to reproduce such audio signals. To attain a power output from these low-impedance speakers that is satisfactory for audio applications, high-power, high-gain amplifiers are required to drive them.

Although modem device fabrication technology has resulted in significant improvements in the performance characteristics of op-amps, most op-amps still have an inherent flaw which commonly is referred to as dc-offset. The inherent dc-offset voltage of an op-amp may be explained as follows. When a common voltage is applied to both inputs of an op-amp, the op-amp typically does not perform as though it has received a common voltage at its inputs but, rather, it performs as if it has received a voltage at a first input that is offset by a particular value from the voltage received at a second input. Therefore, it is common practice to represent an op-amp as having a dc-offset voltage (VOS) located between its inputs or between one of its inputs and a reference (e.g., ground).

A typical amplifier circuit employing an op-amp is shown generally at 20 in FIG. 1.

Referring to FIG. 1, voltage source 25, which is connected between reference node GND and non-inverting input 30 of op-amp 22, represents the inherent dc-offset voltage (VOS) of op-amp 22. Additionally, voltage source 26 represents a dc-offset voltage (VINOFF) present at input 28 of amplifier circuit 20, which has been passed to amplifier circuit 20 from previous stages of the circuit (not shown) in which op-amp 22 is used (i.e., the driving stage(s)). The gain (−N) between input 28 and output 32 of amplifier circuit 20 is selected by adjusting the position of wiper 34 of potentiometer 24, which alters the ratio between the resistance values of its two resistor portions 24A and 24B. If wiper 34 is positioned so that the resistance value of resistor portion 24B is nearly zero, the amplifier circuit 20 is in a maximum gain configuration for the given resistance values. Conversely, if wiper 34 is positioned so that the resistance value of resistor portion 24A is zero, the amplifier circuit 20 is in a muting configuration (i.e., the gain (−N) of the amplifier circuit is equal to zero).

Because of the presence of the dc-offset voltages (VOS and VINOFF), the dc output voltage (VDCOUT) at output 32 of amplifier circuit 20 is determined by the following equation: VDCOUT =(VOS * (1+N)−(VINOFF * N)). It follows, then, that due to the dc-offset voltages, the dc voltage at output 32 will be affected by changes in the gain (−N) of amplifier circuit 20. Consequently, in applications where the value of the gain (−N) is changed by discrete values (rather than by continuous time changes), voltage steps will result at the output of the op-amp circuit. In audio applications, when these voltage steps are large, for example, when an amplifier circuit experiences a discrete change from a circuit configuration having a large value of N to a muting configuration, or vice versa, an audible "click" or "pop" may result when the resultant voltage step is output by a speaker.

Many modern audio producing devices have a muting function, e.g., mute buttons on remote controls of televisions and stereos. Therefore, amplifier circuits are required for such devices that somehow prevent the annoying clicking or popping described above. One way to reduce the adverse effects of dc-offset voltages in amplifier circuits is to calibrate the circuits so as to compensate for the dc-offset voltages thereof.

For example, a known method for calibrating the dc-offset of a digital-to-analog converter (DAC) circuit includes the steps of: (1) forcing the digital input signal of the DAC to zero, (2) converting the digital input signal to an analog signal, (3) temporarily converting an amplifier in the DAC into a comparator, (3) using this comparator to compare the analog conversion of the digital input signal to an analog ground, and (4) adding or subtracting a digital value (representing a dc-offset compensation voltage) to or from the digital input signal at a digital summation node until the output of the comparator switches states. In this manner, a digital representation of a dc-offset voltage of the entire DAC circuit is obtained and thereafter is added continuously to the digital input signal. Such DAC circuits successfully achieve their intended purpose, i.e., to convert a digital input signal into an analog output signal while, at the same time, compensating for the dc-offset voltage of the entire DAC circuit. However, such circuits require a digital input signal and a high-performance DAC in order to function properly.

Frequently, op-amps are employed in circuits having only an analog input signal. Thus, in order to use the known dc-offset voltage compensation technique (applicable to DAC circuits) to compensate for the dc-offset voltage of op-amps in such analog circuits, a user would first have to use an analog-to-digital converter (ADC) to convert the analog input signal into a digital format and then convert the resulting digital signal back into an analog format (using an-offset compensated DAC circuit). Such analog-to-digital and subsequent digital-to-analog conversion would: (1) introduce any dc-offset voltage caused by the ADC into the circuit, which dc-offset voltage would not be compensated for by the offset-compensated DAC circuit, (2) require a large amount of die area to accommodate the high-performance ADC and the DAC circuit, (3) significantly increase the power consumption of the circuit, and (4) increase the probability of signal distortion due to the inherent inaccuracies of ADCs and DACs. Instead, a simple circuit is desired which will compensate for the dc-offset voltage of an op-amp itself, rather than compensating for the dc-offset voltage of an entire DAC circuit, and which does not require a digital input signal and a highperformance DAC in order to function properly.

Dc-offset calibration of op-amp circuits having analog input signals has been accomplished by a circuit which performs the steps of: (1) temporarily converting an amplifier into a comparator, (2) connecting both inputs of the amplifier to a common node, (3) using a counter to control the stepwise injection of a bias current into a node of the amplifier until the output of the amplifier changes states. To control the stepwise injection of bias currents, the circuit employs a counter as follows: (a) the circuit resets the counter to zero (with a zero count of the counter causing a maximum amount of available current from a current DAC to be injected into a node of a first transistor of a differential pair of input transistors of the amplifier), (b) the counter increments its output count until it reaches one-half the value of its maximum count (with the current flowing from the current DAC being stepwise decreased with every increment of the counter), wherein a count equal to one-half of the maximum count causes a minimum amount of current from the current DAC to be injected into the node of the first transistor, (c) when the counter passes the count that is onehalf of its maximum count, the maximum current output of the current DAC then is caused to be injected into a node of a second transistor of the differential pair of input transistors, thus causing the output of the amplifier to switch states, and (d) the counter continues counting until it reaches its maximum count (with the current injected into the node of the second transistor by the current DAC decreasing stepwise in conjunction with the stepwise increase of the output count of the counter), wherein a maximum count of the counter causes a minimum current from the current DAC to be injected into the node of the second transistor. Logic is employed during this stepwise count/current injection process to determine at what current level (and corresponding count) the output of the amplifier (operating as a comparator) was caused to change states due to the current injection (not including the point at which the current was caused to switch from a minimum current in the first transistor to a maximum available current in the second transistor). After a calibration cycle, the bias current level which caused the output of the amplifier to change states then is injected permanently into the node of the amplifier in order to compensate for the dc-offset thereof.

This stepwise current injection (based on an output count of a counter) has several drawbacks. One drawback is that the die area required to implement a seven-bit current DAC may be unacceptably large for many applications. Another drawback is that such a current injection scheme requires a moderate amount of power to be implemented, both during the calibration cycle and after the circuit is calibrated. That is, even after the circuit is calibrated, it constantly will require a biasing current to be injected into a node of a transistor, which results in a static power consumption that may be considered unreasonable under certain circumstances. Additionally, the current injection scheme is not efficient in terms of the time it takes to calibrate an amplifier. That is, the counter merely begins at zero and increments through all of its possible outputs until it happens upon a count which causes a current to be injected into a node of the amplifier which is sufficient to override the inherent dc-offset of the amplifier.

It therefore is a general object of the present invention to provide an improved dc-offset compensation circuit which reduces or eliminates the adverse effects of the dc-offset voltage of an op-amp.

SUMMARY OF THE INVENTION

According to one aspect of the present invention, a circuit and method for calibrating the dc-offset voltage of an amplifier is disclosed. The circuit includes: (a) an amplifier which is configured as a comparator during an offset calibration sequence, (b) a logic circuit coupled to an output of the amplifier to receive a signal from the output of the amplifier and to output an offset compensation control signal representing an offset compensation voltage for the amplifier, and (c) an offset compensation circuit having an input to receive the offset compensation control signal from the logic circuit and a pair of voltage outputs to provide only an offset compensation voltage across its outputs, which outputs are connected to the inputs of the amplifier during an offset calibration sequence. The method includes the steps of: (a) configuring the amplifier as a comparator, (b) coupling a controllable voltage source that generates an offset compensation voltage for the amplifier between a pair of inputs of the amplifier, (c) responsive to an output of the amplifier, generating an offset compensation control signal that controls the offset compensation voltage, and (d) responsive to the offset compensation control signal, adjusting the offset compensation voltage until the offset compensation voltage approximates an inherent offset voltage of the amplifier.

According to an additional aspect of the invention, another circuit and method for calibrating the dc-offset voltage of an amplifier is disclosed. The circuit includes: (a) an amplifier including several primary devices coupled between the amplifier's input and output, (b) at least one secondary device, which is substantially smaller than each of the primary devices, and (c) a switch coupled to either the amplifier or the secondary device to selectively couple the secondary device to the amplifier to alter the effective size of the primary device to compensate for an offset voltage of the amplifier. The method includes the steps of: (a) detecting an offset voltage of the amplifier, and (b) responsive to a detected offset voltage, selectively coupling the secondary device to an internal node of the amplifier to adjust the effective size of the primary device to compensate for the offset voltage of the amplifier.

According to yet another aspect of the invention, another circuit and method for compensating for the offset voltage of an amplifier is disclosed. The circuit includes: (a) an amplifier configurable as a comparator during an offset calibration period, the amplifier having a device internal thereto which has a control lead to control an operating parameter of the device, (b) a logic circuit coupled to the output of the amplifier at least during the calibration period to receive an output from the amplifier and to output an offset compensation control signal, and (c) an offset compensation control circuit coupled to the logic circuit to receive the offset compensation control signal and to provide a control voltage to the operating parameter control lead of the device internal to the amplifier. The method includes the steps of: (a) configuring the amplifier as a comparator, (b) connecting a pair of inputs of the amplifier to a common node or to nodes having known voltages thereon, and (c) responsive to an output signal of the amplifier, selectively adjusting the voltage on the operating parameter control lead of the device internal to the amplifier to compensate for the offset voltage of the amplifier.

According to another aspect, yet another circuit and method for compensating for the offset voltage of an amplifier is disclosed. The circuit includes: (a) an amplifier configurable as a comparator during an offset calibration control period, (b) a logic circuit that, responsive to a clock signal, increases its output when the output signal of the amplifier is in a first logic state and decrease its output when the output signal of the amplifier is in a second logic state, and (c) an offset compensation control circuit that receives an output from the logic circuit and responsive to the output of the logic circuit, compensates for an offset of the amplifier. The method includes the steps of: (a) configuring the amplifier as a comparator, (b) connecting a pair of inputs of the amplifier to a common node or to two nodes having known voltages thereon, and (c) responsive to a first logic state at an output of the amplifier, increasing a value of a compensation control signal that controls the offset compensation of the amplifier, and (d) responsive to a second logic state at an output of the amplifier, increasing a value of a compensation control signal that controls the offset compensation of the amplifier.

DETAILED DESCRIPTION OF THE INVENTION

Figure 1:
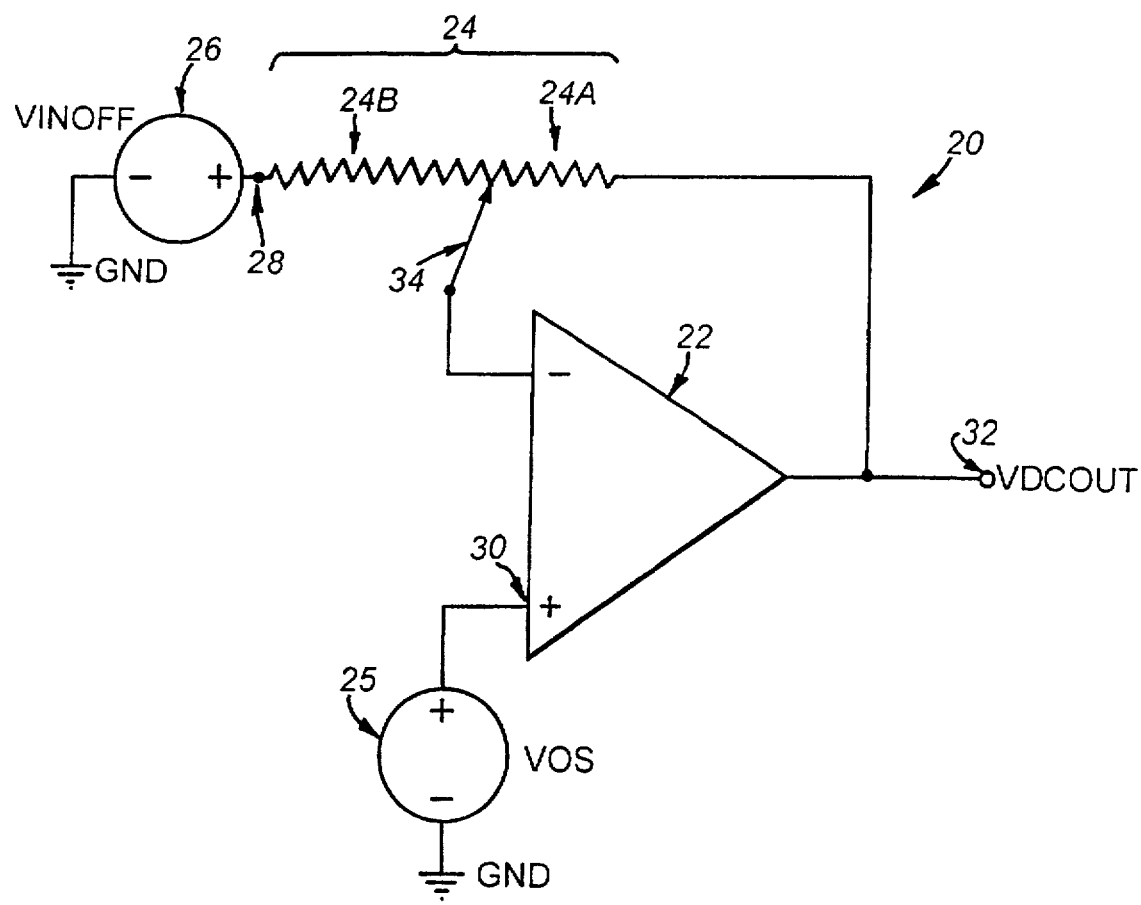
FIG. 1 is a partial schematic/partial block diagram of a prior art amplifier circuit in a gain or attenuation configuration.
Figure 2:
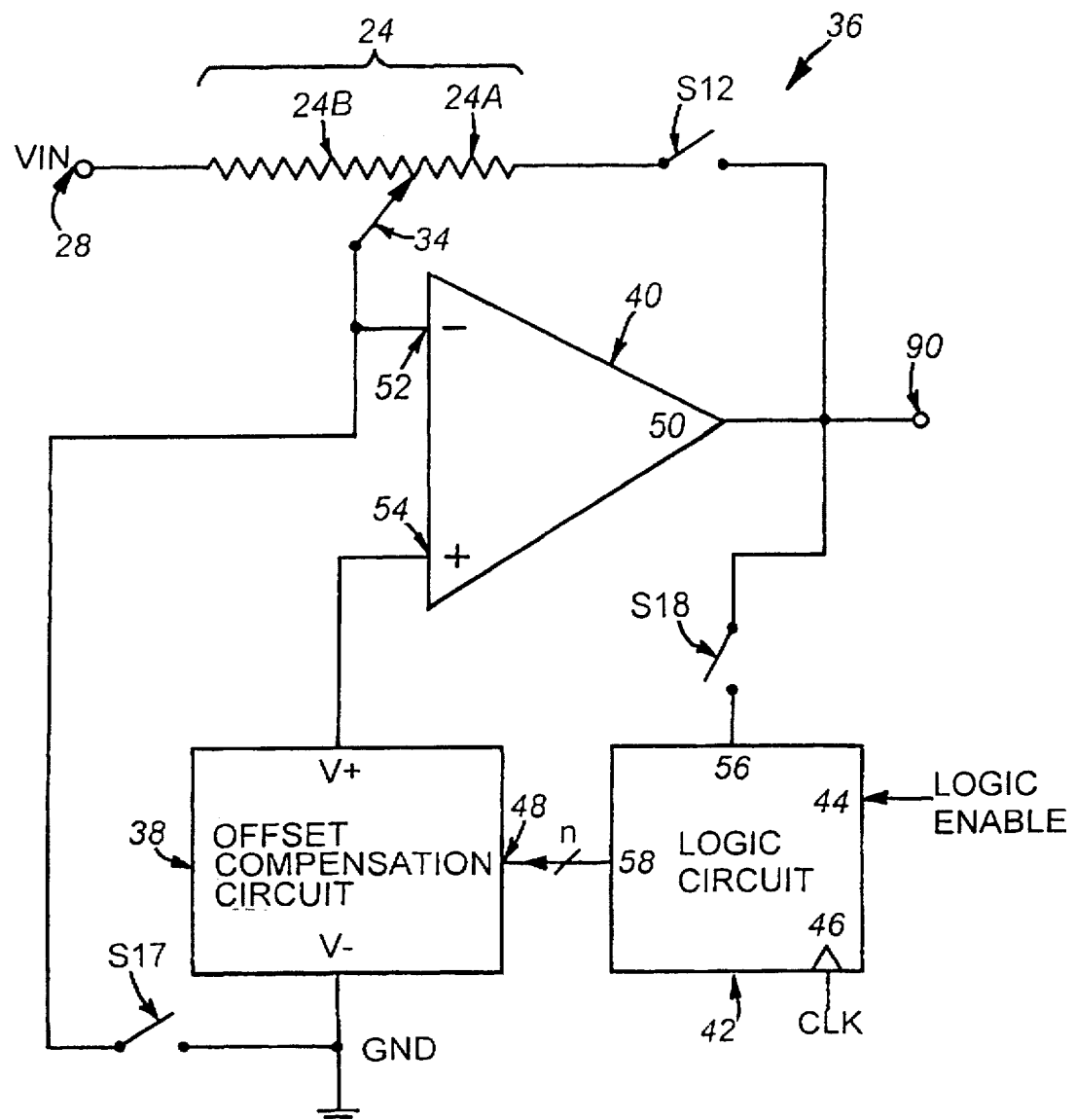
FIG. 2 is a partial schematic/partial block diagram of an offset calibration circuit according to the invention.

FIG. 2 is a block diagram of an offset calibration circuit 36 according to one aspect of the invention. Referring to FIG. 2, when switch S12 is closed and switches S17 and S18 are open, circuit 36 is configured in a gain or attenuation configuration. That is, an input signal $V_{IN}$ presented at node 28 will be output at node 90 after being amplified or attenuated by amplifier circuit 36 (by a factor determined by the ratio of the resistances of resistor portions 24A and 24B of potentiometer 24, which ratio is selected by adjusting the position of wiper 34). Conversely, when switch S12 is open, and switches S17 and S18 are closed, amplifier 40 in circuit 36 is configured as a comparator and, as such, may be calibrated according to one aspect of the present invention. While this configuration of switches is suitable for switching circuit 36 between a gain/attenuation and a comparator configuration, it should be readily apparent to those skilled in the art that any similar switch arrangement could accomplish the desired result (i.e., temporarily configuring amplifier 40 as a comparator). Circuit 36 normally operates in its gain or attenuation configuration and is configured as a comparator only during a particular time interval (i.e., a calibration cycle). It is during this calibration cycle that the dc-offset voltage of amplifier 40 is calibrated.

Such a calibration cycle may be initiated upon power-up of a device including circuit 36 or may be initiated responsive to a user command. During an offset calibration cycle, a voltage is placed across inverting and non-inverting inputs 52 and 54, respectively, of amplifier 40 via outputs V– and V+, respectively, of offset compensation circuit 38. Output 50 of amplifier 40 (which is operating as a comparator) provides a high or low logic signal to input 56 of logic circuit 42, depending on whether amplifier 40 senses a greater voltage at input 52 or at input 54. The voltage that is sensed by amplifier 40 at inputs 52 and 54, and that thus determines the voltage at output 50 of amplifier 40, includes: (1) the voltage across outputs V+ and V– of offset compensation circuit 38, and (2) the inherent dc-offset voltage of amplifier 40. Logic circuit 42 provides an n-bit digital output signal (representing an offset compensation voltage) at output 58 that is received by offset compensation circuit 38 at input 48. During a calibration cycle, the digital output signal at output 58, in response to a clock signal (CLK) at input 46 and depending of the logic level of input 56, is increased or decreased. This increase or decrease in the digital input signal at input 48 of offset compensation circuit 38 causes a corresponding increase or decrease in the offset compensation voltage across outputs V+ and V– of offset compensation circuit 38.

In one embodiment of the circuit shown in FIG. 2, offset compensation circuit 38 and logic circuit 42 can be implemented with a DAC and an up/down counter, respectively. Any circuitry, however, which performs a substantially equivalent function to that performed by these devices may alternatively be used without departing from the scope of the invention. The digital "count" output of up/down counter 42 at output 58 controls the voltage level across outputs V+ and V– of DAC 38. When a signal LOGIC ENABLE 122 (at counter enable input 44 of up/down counter 42) is asserted, e.g., is in a logic high state, up/down counter 42, responsive to a clock signal (CLK) at input 46, will cause up/down counter 42 to increment or decrement its count at output 58. Whether up/down counter 42 increments or decrements its count depends on the state (i.e., logic high or logic low) of the signal received by up/down selection input 56 of up/down counter 42 from amplifier 40. Thus, if the input voltage at up/down selection input 56 is in a first state (e.g., logic high), up/down counter 42 will increment its output count by one every clock cycle so long as up/down counter 42 is enabled, and if the input voltage at up/down selection input 56 is in a second state (e.g., logic low) up/down counter 42 will decrement its output count by one every clock cycle so long as up/down counter 42 is enabled.

During a calibration cycle, i.e., when amplifier 40 is configured as a comparator and up/down counter 42 is enabled, the voltage across outputs V+ and V– of DAC 38 will increase or decrease every clock cycle corresponding to changes in the digital signal, i.e., the count, at input 48. For example, if the voltage across outputs V+ and V– of DAC 38 is less than the inherent dc-offset voltage of amplifier 40, output 50 of amplifier 40 will provide a logic high voltage, up/down counter 42 will increment its count by one, and the voltage across outputs V+ and V– of DAC 38 will increase by a discrete voltage level corresponding to the change in the digital count at input 48. In this manner, the voltage across outputs V+ and V– of DAC 38 will increase or decrease every clock cycle until this voltage approximates the inherent dc-offset voltage of amplifier 40.

When the inherent dc-offset voltage of amplifier 40 is reached, the output of amplifier 40 will switch states. This switching of states will cause up/down counter 42 to reverse the direction of its count, causing the voltage across outputs V+ and V– to change accordingly, and thus causing the output of amplifier 40 to switch states once again. Therefore, once the dc-offset voltage of amplifier 40 is approximated by the voltage across outputs V+ and V−, the output of amplifier 40 will switch states every clock cycle until the signal LOGIC ENABLE 122 at input 44 of up/down counter 42 is deasserted, e.g., placed in a logic low state. After the signal LOGIC ENABLE 122 is deasserted, the final output count of up/down counter 42 is maintained at output 58, and is used as a permanent input to DAC 38. At the end of the calibration cycle, switch S12 is closed and switches S17 and S18 are opened to reconfigure circuit 36 in a gain or attenuation configuration. Due to the dc-offset calibration cycle, however, the voltage between outputs V+ and V− of DAC 38 now is applied, respectively, between non-inverting input 54 of amplifier 40 and a reference node, e.g., ground node GND, thereby compensating for the inherent dc-offset voltage of amplifier 40.

For this calibration circuit to function properly, the maximum positive and negative offset compensation voltages which can be produced by DAC 38 (based on the output of up/down counter 42) should be larger than the expected inherent dc-offset voltage of amplifier 40. Also, the calibration cycle should be long enough with respect to a clock (CLK) period such that a sufficient number of clock cycles occur during the calibration period to ensure that up/down counter 42 will reach its maximum or minimum count, if required, during a single calibration period. Additionally, if possible, up/down counter 42 should be configured such that once its minimum or maximum count is reached, it maintains that count rather than wrapping to the maximum or minimum count, respectively.

Figure 3:
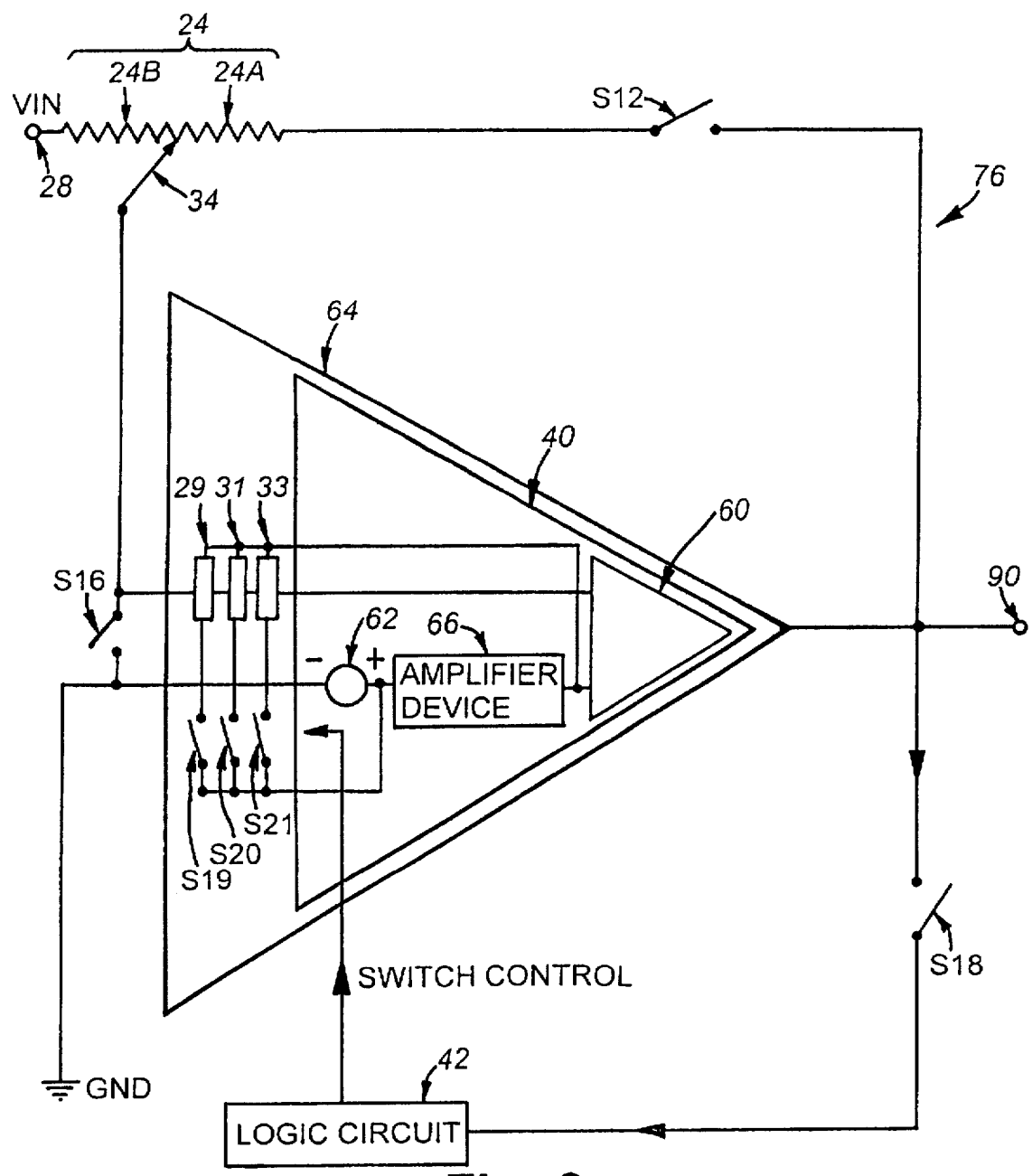
FIG. 3 is a partial schematic/partial block diagram of another offset calibration circuit according to the invention.

FIG. 3 is a block diagram of a circuit 76 according to another aspect of the invention. As shown, circuit 76 is similar to circuit 36, except that the dc-offset voltage calibration of the amplifier in circuit 76 is accomplished by using several switches to alter the effective size of a primary device, e.g., a transistor, which is internal to amplifier 40. Primary amplifier device 66 in FIG. 3 could represent, for example, a transistor in a current mirror of the amplifier or one of a differential pair of input transistors. Secondary amplifier devices 29, 31 and 33 represent amplifier devices, e.g., transistors, which are substantially smaller than primary amplifier device 66. For example, if the primary and secondary devices are transistors, then the secondary transistor could have a channel length that is substantially (e.g., a factor of 100) shorter than the channel length of the primary transistor (or a channel width that is substantially (e.g., a factor of 100) wider than the channel width of the primary transistor).

In FIG. 3, (conceptual) amplifier 60 represents an ideal op-amp, i.e., an op-amp with no inherent dc-offset voltage. Amplifier 40 represents an actual amplifier and includes ideal amplifier 60, primary amplifier device 66 and voltage source 62 (representing the inherent dc-offset of amplifier 40). Op-amp 64, which includes secondary amplifier devices 27, 29 and 33 and switches S19, S20 and S21 (which are configured to switchably connect secondary devices 29, 31 and 33 in parallel with primary amplifier device 66) represents a dc-offset voltage compensating amplifier according to this aspect of the invention.

In a similar manner as with circuit 36, when switches S16 and S18 are open and switch S12 is closed, circuit 76 is configured as an amplifier or attenuator and an input signal $V_{IN}$ presented at node 28 will be amplified or attenuated (by a factor depending on the ratio of the resistances of resistor portions 24A and 24B of potentiometer 24, which ratio is determined by the position of wiper 34) and output at node 90. Conversely, when switches S16 and S18 are closed and switch S12 is open, amplifier 64 will be configured as a comparator and, as such, may be used to calibrate the inherent dc-offset voltage of amplifier 40 (which actually is a part of amplifier 64). Switch S16 is employed to electrically short together inputs 52 and 54 of amplifier 64 (when it is configured as a comparator during the calibration cycle). Again, the configuration of switches S12, S16 and S18 shown in circuit 76 is merely exemplary and any similar switching configuration that achieves a similar result alternatively may be employed.

A calibration cycle to calibrate amplifier 64 using circuit 76 may be initiated upon power up of a device including circuit 76 or may be initiated responsive to a user command. As mentioned previously, amplifier 64 is configured as a comparator during a particular time interval, i.e., the calibration cycle. Logic circuit 42 (which receives an output of the comparator) outputs a logic signal that controls several switches, e.g., switches S19, S20 and S21, which switches selectively connect corresponding secondary amplifier devices, e.g., secondary amplifier devices 29, 31 and 33, in parallel with a primary amplifier device, e.g., primary amplifier device 66.

At the end of a calibration cycle, when the intentionally created offset voltage introduced by the secondary amplifier devices should approximate the inherent dc-offset voltage (represented by voltage source 62) of amplifier 40, the final digital output of logic circuit 42 is held by logic circuit 42 and is used to permanently maintain the positions of the several switches, e.g., switches S19, S20 and S21, when amplifier 64 returns to normal operation (e.g., a gain or attenuation configuration). In this manner, switches S19, S20 and S21 (by controlling which of secondary amplifier devices 29, 31 and 33 are connected in parallel with primary amplifier device 66) may be used to calibrate the inherent dc-offset voltage of amplifier 40 by optimizing the effective size, for example, of a current mirror transistor within amplifier 40, as is explained in more detail below.

Figure 4:
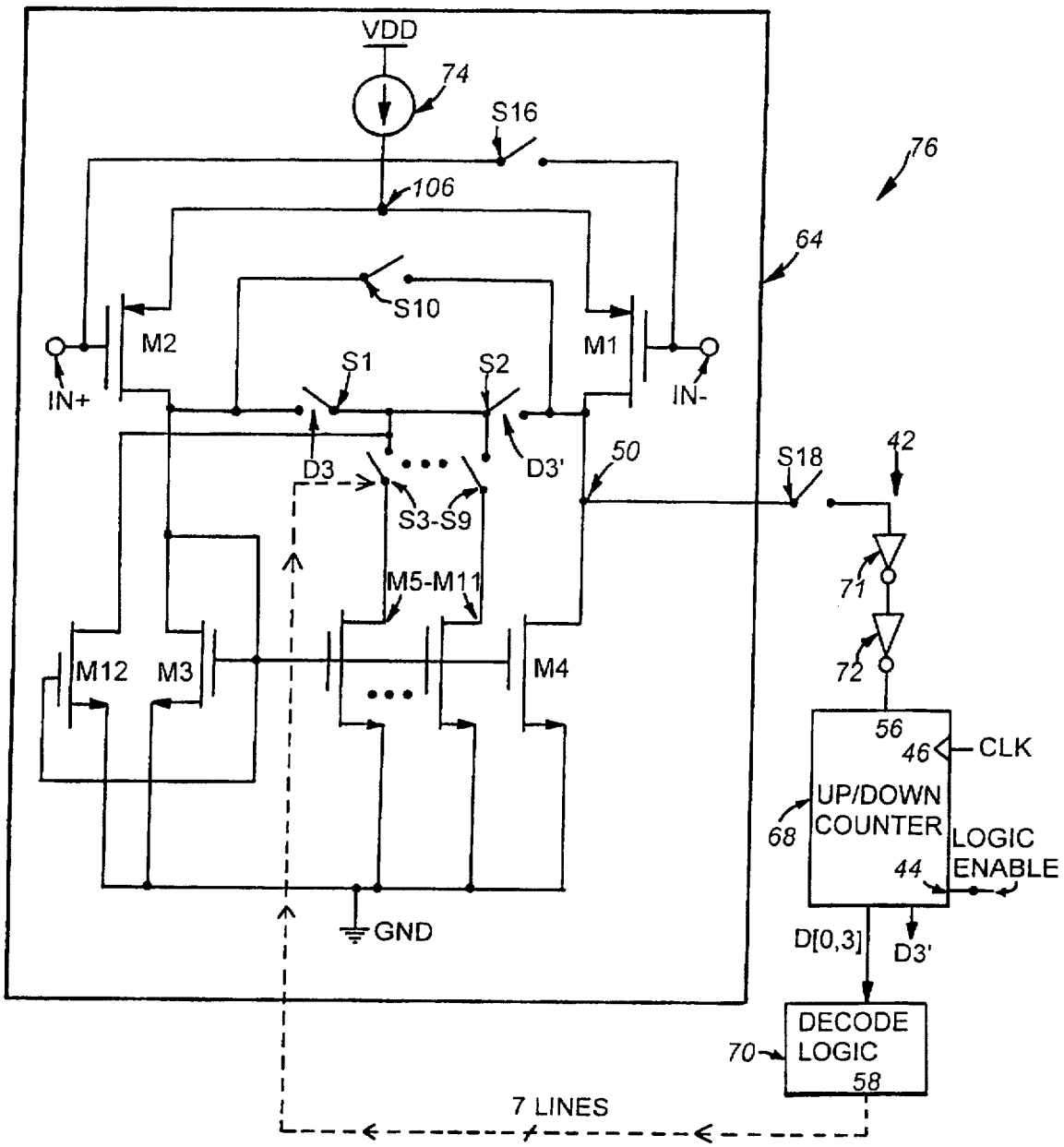
FIG. 4 is a more detailed partial schematic/partial block diagram of the offset calibration circuit shown in FIG. 3.

FIG. 4 is a more detailed diagram of an exemplary embodiment of circuit 76. As shown, a differential pair of (p-channel) input transistors M1 and M2 share a common source node 106. The common source node 106 is connected to and driven by current source 74, which also is connected to positive supply voltage node VDD. Complementary input nodes IN− and IN+ are connected to the gates (i.e., the control electrodes) of transistors M1 and M2, respectively. The output (i.e., the drain) of transistor M2 is connected to the drain of transistor M3, which drain is an input to a current mirror including (n-channel) transistors M3 and M4. The drain of transistor M3 is connected to the gate of transistor M3 as well as to the gate of transistor M4, and the sources of transistors M3 and M4 are connected to ground node GND. The output of the current mirror comprising transistors M3 and M4, i.e., the drain of transistor M4, is connected to the output, i.e., the drain, of input transistor M1 at output node 50.

Since amplifier 64 in circuit 76 is configured as a comparator during its calibration cycle, the voltage at output node 50 during this cycle will represent either logic high or logic low, depending on the value of the voltages applied to input nodes IN+ and IN−. Logic circuit 42 includes buffer inverters 71 and 72, up/down counter 68, and decode logic circuit 70. Output 50 is connected via switch S18 (which is closed during the calibration cycle) and buffer inverters 71 and 72 to the up/down selection input 56 of up/down counter 68. Up/down counter 68 also receives a signal LOGIC ENABLE 122 and a clock (CLK) signal at inputs 44 and 46, respectively. When the signal LOGIC ENABLE 122 at input 44 is asserted, e.g., during a calibration cycle, up/down counter 68, responsive to a rising edge of the clock signal at input 46, will count up or down, depending on the state of the up/down selection signal at input 56.

The four-bit (for example) output count (i.e., bits D0, D1, D2 and D3) of up/down counter 68 is passed to decode logic circuit 70, which circuit decodes the output count and outputs seven individual control lines at output 58. Each of these individual control lines carries a logic high or a logic low signal which is used to control one of seven switches S3–S9 (three of which could correspond with switches S19, S20 and S21 in FIG. 3) within amplifier 64, as is explained in more detail below. In addition, the most significant bit (D3) and the complement of the most significant bit (D3') of the output count are used to control switches S1 and S2, respectively, within amplifier 64.

Each of (n-channel) transistors M5–M11 in circuit 76 has a channel length that is similar to the channel length of transistor M4, but has a channel width that is substantially smaller than the channel width of transistor M4. In an exemplary embodiment, the channel width of transistor M4 is approximately one hundred times the channel width of each of transistors M5–M11. The sources and gates of each of transistors M5–M11 are connected, respectively, to ground node GND and to the gate of transistor M4. The drain node of each of transistors M5, M6, M7, M8, M9, M10, and M11 is connected to one pole of a corresponding one of switches S3, S4, S5, S6, S7, S8 and S9. By using switches S1–S9 to selectively connect or disconnect the drain nodes of transistors M5–M11 to or from either the output of transistor M1 or the output of transistor M2, the effective size of current mirror transistor M4 is increased or decreased. This trimming of the effective size of current mirror transistor M4 will, in turn, change the current flowing through the current mirror (comprised of transistors M3 and M4, as well as any of transistors M5–M11 that are switched in parallel with transistor M4) by discrete amounts. These discrete changes in current mirror output current will, in turn, alter the dc-offset voltage of the amplifier by discrete voltage values. Transistor M12 has its drain connected to the common node between switches S1–S9, its gate connected to the gate of transistor M4 and its source connected to ground node GND. Transistor M12 can have a channel length that is approximately twice the channel length of each of transistors M5–M11 and is used to add a slight offset to the amplifier when either switch S1 or S2 is activated, thus stabilizing the output signal at output 50.

As explained previously, up/down counter 68 and decode logic circuit 70 cooperate to control switches S1–S9 so as to increment or decrement the dc-offset correction voltage (created by transistors M5–M11) in conjunction with the counting up or counting down, respectively, of up/down counter 68. Without departing from the scope of the invention, switches analogous to switches S1–S9, by controlling corresponding devices which are appropriately connected, also could be used to alter the effective size of any device in the amplifier so as to compensate for the amplifier's inherent dc-offset voltage. For example, the effective size of the other current mirror transistor M3 could be trimmed using switches comparable to switches S1–S9.

During a calibration cycle, i.e., when amplifier 64 is configured as a comparator and the signal LOGIC ENABLE 122 at input 44 of up/down counter 68 is asserted, inputs IN+ and IN– are shorted together by closing shorting switch S116. Thus, any inherent dc-offset voltage of amplifier 40 will result in a corresponding logic state appearing at output 50 of amplifier 64. Up/down counter 68 will count either up or down, responsive to a clock signal at input 46, depending on the state of the signal at input 56. As the current in the current mirror (comprised of transistors M3 and M4, and any of transistors M5–M11 that are switched in parallel therewith) increases or decreases incrementally along with changes in the output count of up/down counter 68, at some point in the counting, the dc-offset voltage created by transistors M5–M11 will approximate the otherwise inherent dc-offset voltage of amplifier 40, and the signal at output 50 will change states. This change in state of the signal at output 50 will cause up/down counter 68 to count in the opposite direction, which, in turn, will cause the signal at output 50 to change states once again.

Thus, when the inherent dc-offset voltage (represented by voltage source 62) of amplifier 40 is approximated by the dc-offset voltage caused by transistors M5–M11, the signal at output 50 will change states every clock cycle, causing the counter to toggle its least significant bit until the end of the calibration cycle. At the end of the calibration cycle, the final digital count of up/down counter 68 is maintained by up/down counter 68 after the signal LOGIC ENABLE 122 is deasserted. This maintained data then is used to engage or disengage each of switches S1–S9 permanently, as determined by the maintained data, after amplifier 64 is reconfigured in its normal operational mode (e.g., in a gain or attenuation configuration). For this calibration circuit to function properly, the maximum positive and negative offset compensation voltages which can be produced trimming transistor M5–M11 (based on the output of logic circuit 42) should be larger than the expected inherent dc-offset voltage of amplifier 40. Also, the calibration cycle should be long enough with respect to the clock (CLK) period such that a sufficient number of clock cycles occur during the calibration period to ensure that up/down counter 68 will, if necessary, reach its maximum or minimum count during a single calibration period. In addition, if possible, up/down counter 68 should be configured such that once its minimum or maximum count is reached, it maintains that count rather than wrapping to the maximum or minimum count, respectively.

At the end of a calibration cycle, switch S18 is opened and output 50 of amplifier 64 is reconnected to the circuit in which the amplifier is used. If output 50 has a logic high voltage present at the end of a calibration cycle, it might cause a voltage spike at an output of the circuit when it is reconnected to the circuit. Therefore, switch S10, which is connected between the outputs of the differential pair M1 and M2, is used to short output 50 to the output of transistor M2 just before the calibration cycle terminates. Because transistor M3 is diode-connected to ground node GND, the voltage at the output of transistor M2 remains relatively stable. Thus, shorting output 50 to the output of transistor M2 will reduce the voltage at output 50 to the voltage level at the output of transistor M2, thereby substantially reducing the amplitude of the voltage spike which might occur during the transition out of the calibration cycle.

Figure 5:
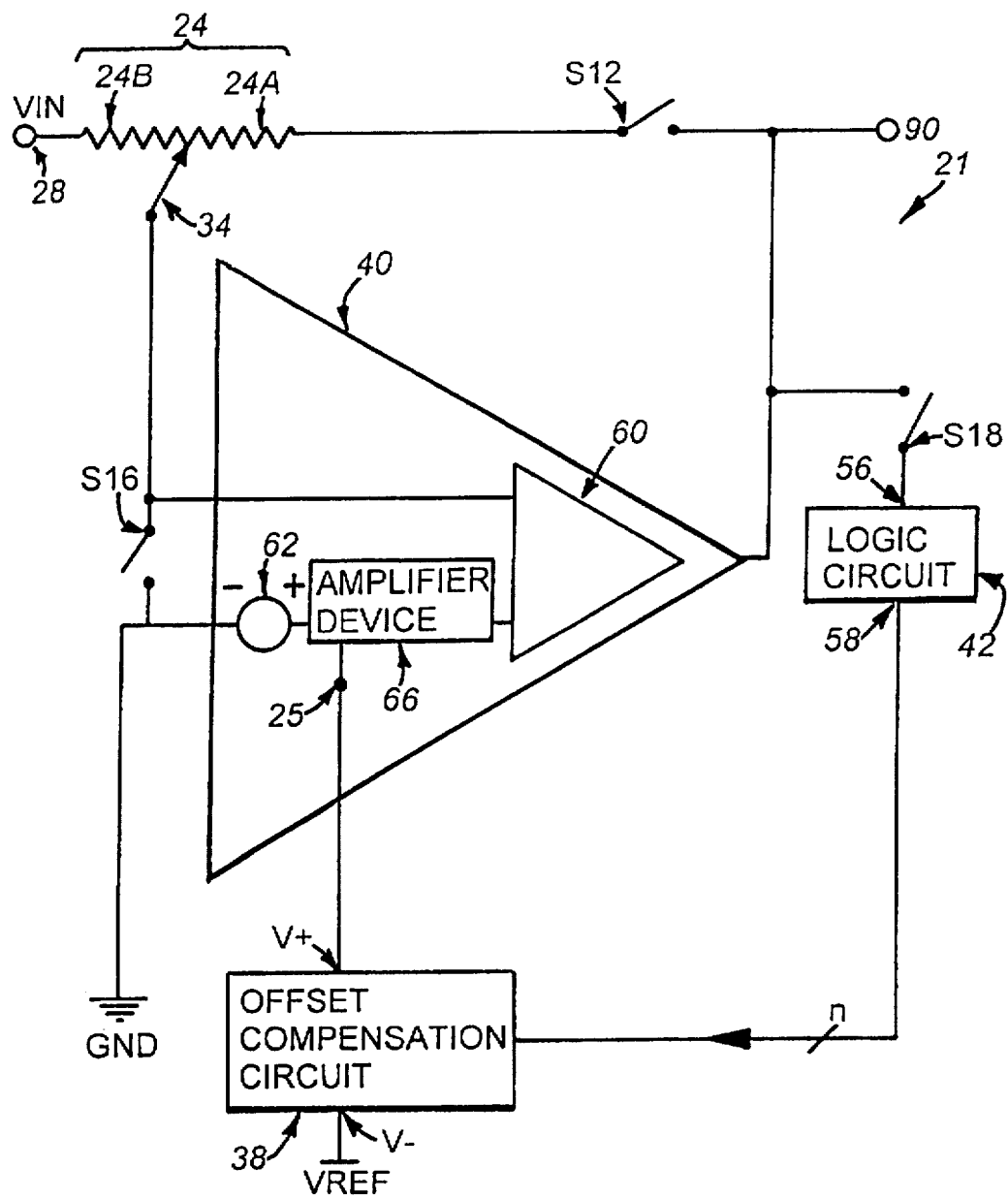
FIG. 5 is a partial schematic/partial block diagram of yet another offset calibration circuit according to the invention.

FIG. 5 shows another circuit 21 according to yet another aspect of the invention. Circuit 21 is similar to circuit 76 (shown in FIG. 3) except for the manner in which an intentionally created offset voltage is created with amplifier device 66. Again, amplifier 40 is converted into a comparator (during a calibration cycle) by opening switch 12. Switches S16 and S18 also are closed during a calibration cycle. The closing of switch S16 (i.e., electrically shorting the inputs of amplifier 40) causes any inherent dc-offset voltage of amplifier 40 (e.g., the dc-offset voltage represented by voltage source 62) to force an output of amplifier 40 (operating as a comparator) to a particular state (e.g., logic high or logic low). Logic circuit 42 receives the logic high or logic low output of amplifier 40 at input 56 and, responsive to a clock signal, increases or decreases the value of a multi-bit output signal at output 58. Logic circuit 42 could be, for example, an up/down counter having its up/down select input connected to the output of amplifier 64.

The multi-bit output of logic circuit 42 is provided to input 48 of offset compensation circuit 38. Offset compensation circuit 38 could be, for example, a simple DAC that has an input 48 to receive the multi-bit output signal from output 58 of logic circuit 42 as well as positive and negative voltage outputs V+ and V−, respectively, across which an analog conversion of the digital input signal is provided. Negative voltage output V− is connected to a reference node having a particular voltage thereon. Positive voltage output V+ is connected to operating characteristic input lead 25 of amplifier device 23. Amplifier device 23 could represent, for example, a transistor in a current mirror of amplifier 40 and operating parameter control lead 25 could represent a lead which is connected to the substrate of the transistor. The output of offset compensation circuit 48, then, would bias the substrate of a transistor in amplifier 40. Such a biasing of the substrate of a transistor in amplifier 40 would cause a distinct alteration of the dc-offset voltage of amplifier 40.

Therefore, if logic circuit 42 is an up/down counter, offset compensation circuit 38 is a DAC and amplifier device 23 is a transistor in a current mirror of amplifier 40, then the counting up or down of logic circuit 42 would cause a stepwise increase or decrease in the dc-offset voltage introduced by the biasing of the substrate of the transistor. The calibration sequence used to calibrate the dc-offset of amplifier 40 in circuit 21 is similar to that used to calibrate the amplifiers in the circuits shown in FIGS. 2, 3 and 4. That is, logic circuit 42, e.g., an up/down counter, would count up or down in response to the logic level at its up/down select input until the inherent dc-offset voltage of amplifier 40 is approximated by the offset voltage intentionally introduced by the biasing of an operating characteristic of amplifier device 23. After a calibration cycle, then, the final output of logic circuit 42 may be held so as to maintain the voltage across outputs V+ and V− of offset compensation circuit 48, thereby permanently compensating for the dc-offset voltage of amplifier 40. Switches S16 and S1 8 may thereafter be opened and switch 12 may be closed so as to reconfigure amplifier circuit 21 in a gain or attenuation configuration.

When an op-amp is configured as a comparator during a calibration cycle, the output of the op-amp must be switched out of the circuit in which it is used to avoid having the comparator's output signal, i.e., a high/low switching signal, influence the output of the circuit. Such a switching signal would be highly undesirable, for example, in an audio reproduction application as it would cause noise to emanate through an output device (such as a speaker). Instead, it is desirable generally to switch the amplifier/comparator out of the circuit and to maintain a constant signal level at the output of the circuit throughout the duration of the calibration sequence. The output signal level of the circuit should remain constant: (1) during the time period that the amplifier/comparator is switched out of the circuit, (2) during the time period the amplifier/comparator is being used as a comparator to calibrate the dc-offset, and (3) during the time period that the amplifier/comparator is switched back into the circuit.

Figure 6:
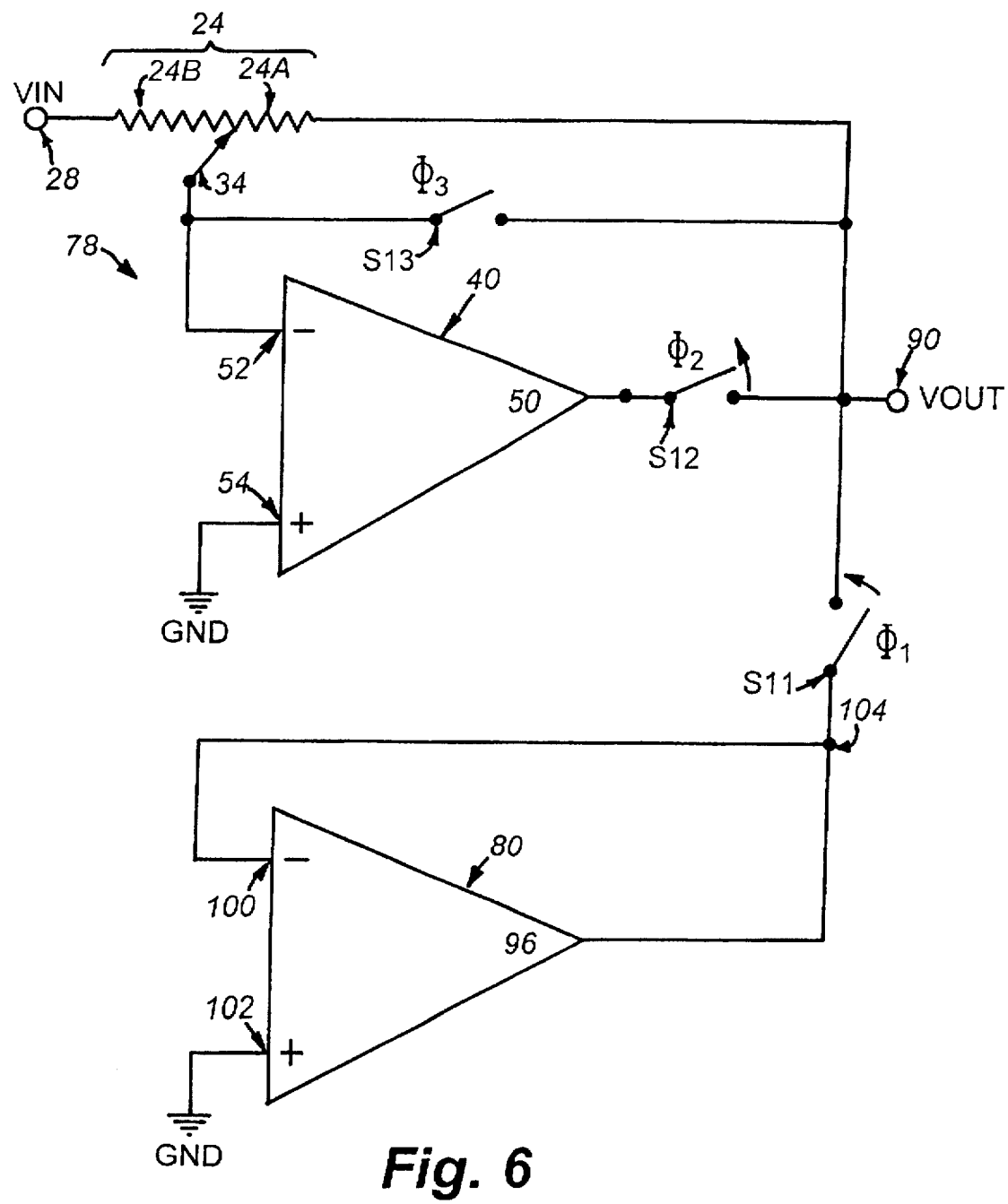
FIG. 6 is a partial schematic/partial block diagram of an amplifier circuit including a main amplifier, which is calibrated according to the invention, and a catching amplifier, which is used to maintain a relatively constant voltage level at the output of the amplifier circuit when the main amplifier is disconnected from and/or reconnected to the amplifier circuit.

FIG. 6 is a circuit 78 that is designed to reduce voltage glitches at an output of a circuit when an output of an amplifier is switched out of and back into the circuit in order to undergo, for example, offset calibration. As shown, main amplifier 40 in circuit 78, which also could represent amplifier 40 in circuit 36 (shown in FIG. 2), amplifier 40 (as a part of amplifier 64) in circuit 76 (shown in FIGS. 3 and 4), or amplifier 40 in circuit 21 (shown in FIG. 5), receives an input signal at inverting input 52 (through resistor portion 24B of potentiometer 24) from input node 28. Potentiometer 24 (comprising resistor portions 24A and 24B) is connected between input node 28 and output node 90 of amplifier circuit 78 so as to allow the gain or attenuation of amplifier circuit 78 to be altered by adjusting the position of wiper 34. Non-inverting input 54 of main amplifier 40 is connected to a constant voltage reference node, e.g., ground node GND. Catching amplifier 80 in circuit 78 should be (proportionately) substantially identical to (although it may be substantially smaller than) main amplifier 40, as voltage glitches are reduced most effectively when these two amplifiers match one another (at least proportionately). Catching amplifier 80 could be, for example, two hundred times smaller than main amplifier 40 in order to reduce the power consumption of the circuit when catching amplifier 80 is switched into the circuit in place of main amplifier 40, as explained below.

Circuit 78 includes three switches S11, S12 and S13, which are controlled by switch control signals represented by the symbols Φ1, Φ2 and Φ3, respectively, shown next to the switches. Switch S11 is connected between output 96 of catching amplifier 80 and output node 90 of circuit 78, and is used to connect catching amplifier 80 to output node 90 during a time interval when the signal Φ1 is asserted. Switch S12 is connected between output 50 of main amplifier 40 and output node 90 of circuit 78, and is used to disconnect output 50 from output node 90 during a time interval when the signal Φ2 is asserted. Switch S13 is connected between output node 90 and inverting input 52 of main amplifier 40, and is used to place main amplifier 40 in a muting configuration during a time interval when the signal Φ3 is asserted and the signal Φ2 is deasserted. That is, when switches S12 and S13 are closed, amplifier 40 has its inverting input connected to its output and, thus, is in a unity-gain feedback configuration. In such a unity-gain configuration the voltage at output 50 will follow the voltage at non-inverting input 54. Since non-inverting input 54 is connected to a constant voltage reference node, e.g., ground node GND, when switches S12 and S13 are closed, the voltage at output 50 will remain permanently at a voltage near the reference voltage, e.g., ground potential, regardless of the voltage placed at input node 28. Therefore, circuit 78 has a gain of approximately zero between input node 28 and output node 90. As used herein, an amplifier circuit in a muting configuration means any amplifier circuit configured to have a gain of approximately zero between its input and its output.

Catching amplifier 80 has a conductor connected between its inverting input 100 and its output 96 to place it permanently in a unity-gain feedback configuration. Catching amplifier 80 also has its non-inverting input 102 connected to a constant voltage reference node, e.g., ground node GND. Thus, when switch S11 is closed and switch S12 is open, output 90 of circuit 78 will be driven by catching amplifier 80 and, as such, circuit 78 will be configured to have a gain of approximately zero between input node 28 and output node 90. Therefore, amplifier circuit 78 may be placed in a muting configuration either by closing switch S13 (when switch S12 is closed) or by closing switch S11 (when switch S12 is open).

Figure 7:
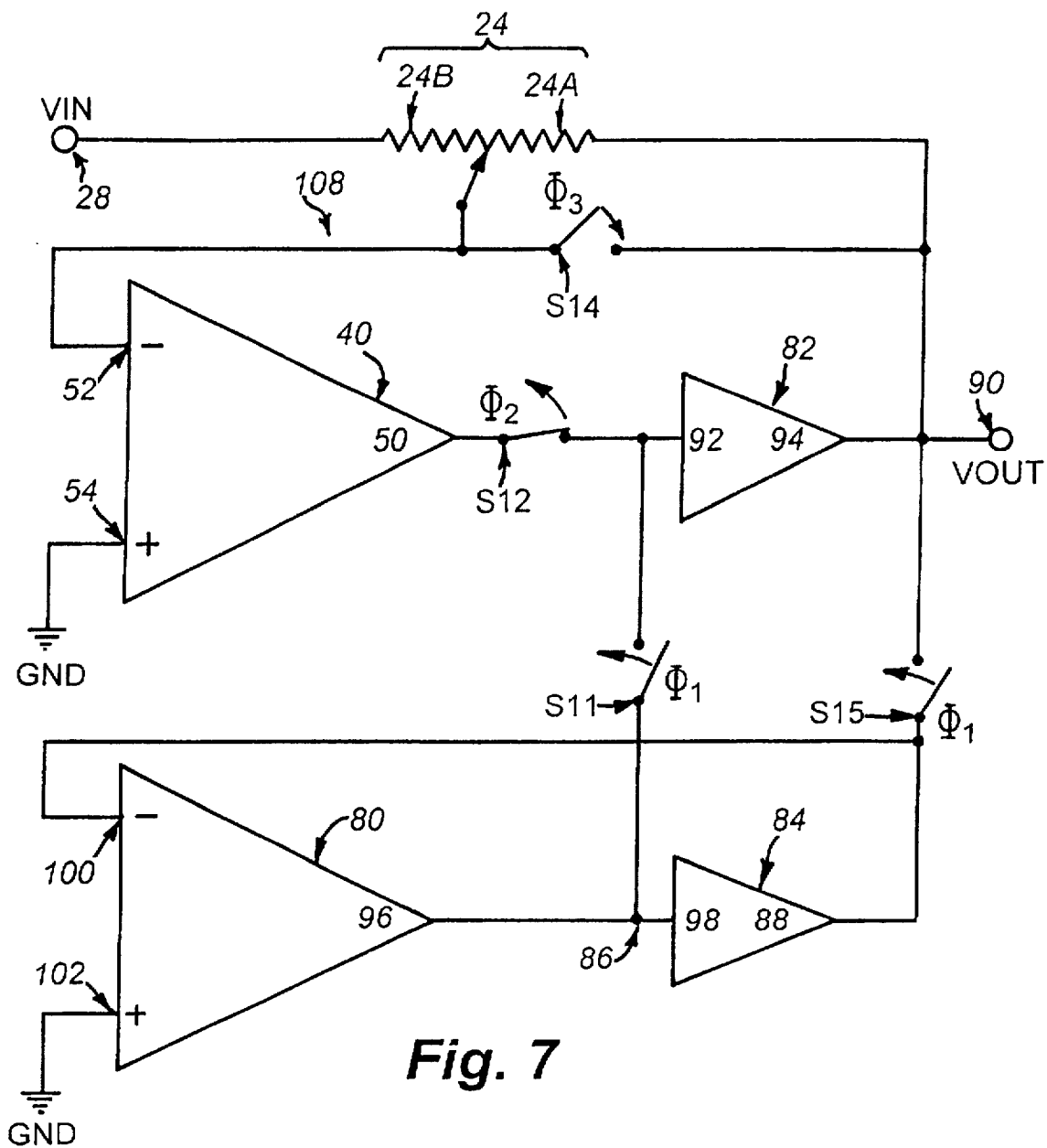
FIG. 7 is a partial schematic/partial block diagram of another amplifier circuit including a main amplifier having a first stage and a second stage, which first stage is calibrated according to the invention, and a catching amplifier, which is used to maintain a relatively constant voltage level at the output of the amplifier circuit when the first stage of the main amplifier is disconnected from and/or reconnected to the amplifier circuit.
Figure 8:
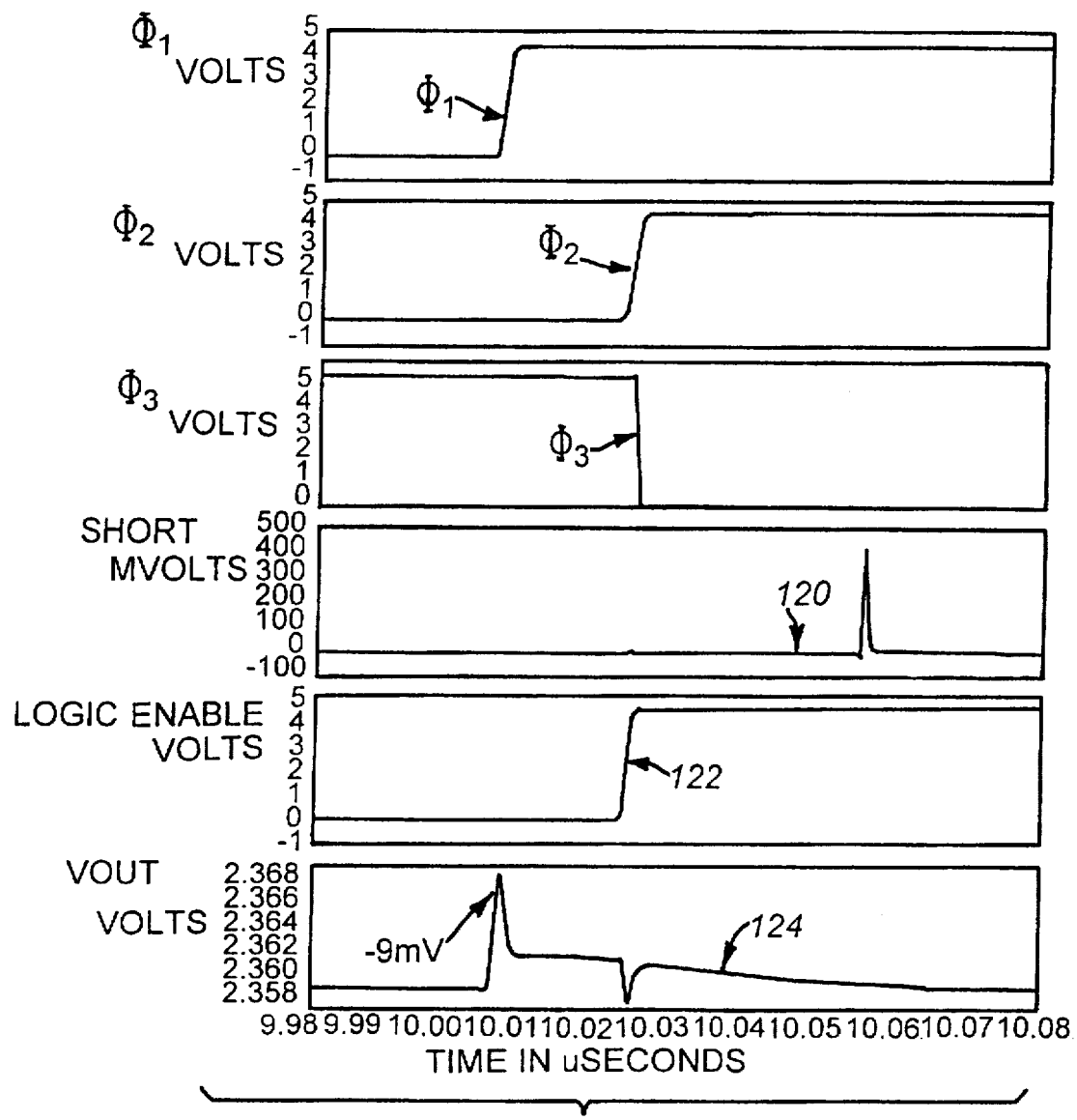
FIG. 8 is a timing diagram of several signals used in conjunction with the offset calibration circuits shown FIGS. 2–5 and the amplifier circuits shown in FIGS. 6 and 7 when those circuits enter an amplifier offset calibration cycle.
Figure 9:
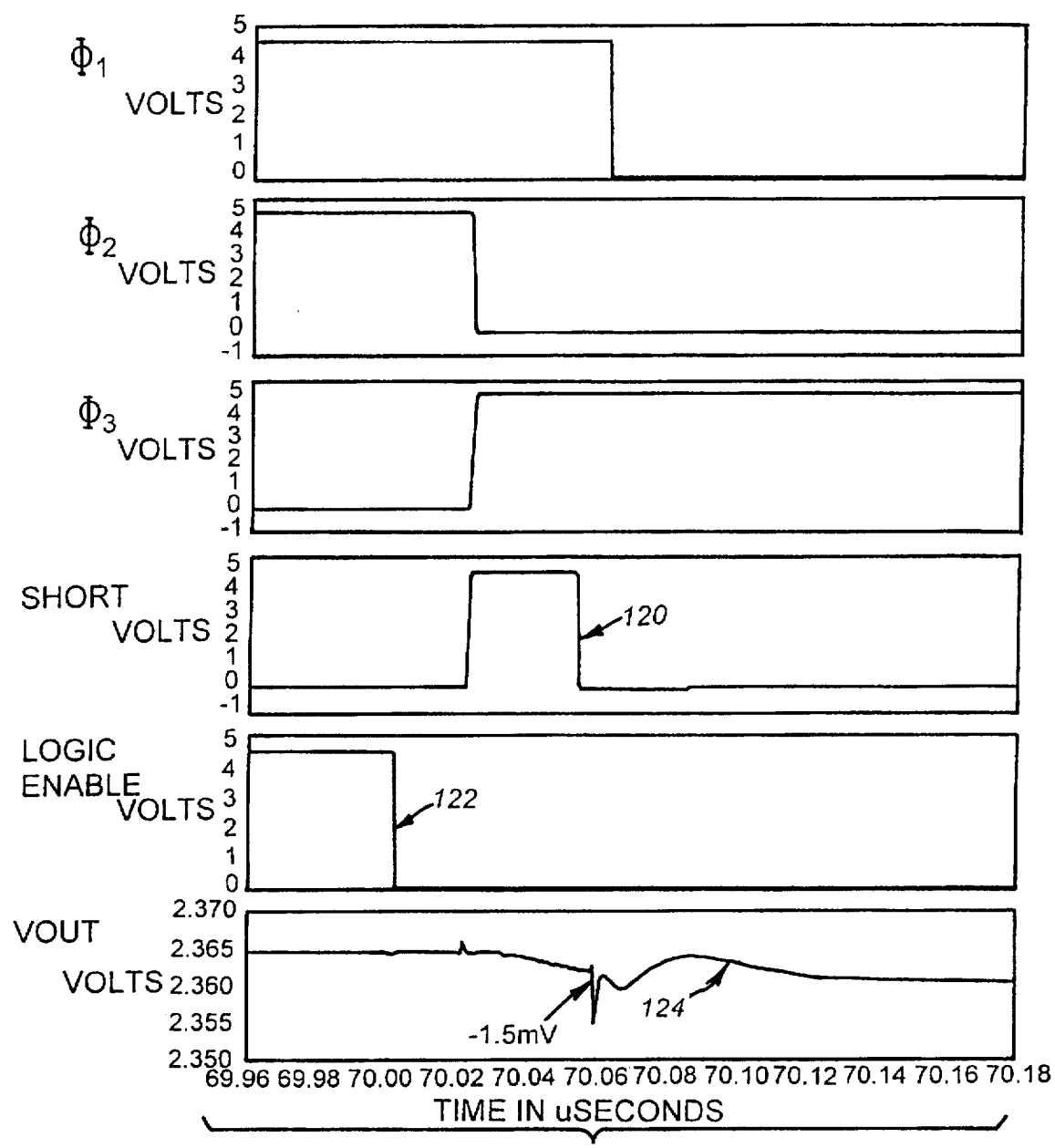
FIG. 9. is a timing diagram of several signals used in conjunction with the offset calibration circuits shown FIGS. 2–5 and the amplifier circuits shown in FIGS. 6 and 7 when those circuits exit an amplifier offset calibration cycle.

The signals Φ1, Φ2 and Φ3 are shown in the timing diagrams of FIGS. 8 and 9, along with several other signals. These signals are shown on the same time scale (horizontal axis) for comparison. The physical placement of one signal above another does not denote that one attains a higher magnitude than the other signals. The signal SHORT 120 in FIGS. 8 and 9 represents the signal controlling the operation of switch S10 in FIG. 4, the signal LOGIC ENABLE 122 represents the signal at input 44 of logic circuit 42 (shown in FIGS. 2, 3, 4 and 5), and the signal VOUT 124 represents the output voltage at the output node 90 of circuit 78 (or of circuit 108 (shown in FIG. 7)). Although the signal VOUT 124 (shown in FIGS. 8 and 9) is the output voltage resulting from a circuit simulation of circuit 108, a simulation of circuit 78 should yield a similar result. Each of switches S11, S13 and S10 is closed when its respective signal Φ1, Φ3 and SHORT 120 is asserted, while switch S12 is opened when the signal Φ2 is asserted.

The timing diagram of FIG. 8, in conjunction with FIG. 6, shows how circuit 78 enters its calibration cycle. All of the signals are deasserted prior to entering a calibration cycle. First, the signal Φ3 is asserted so as to place amplifier circuit 78 in a muting configuration (by closing switch S13). Secondly, the rising edge of the signal Φ1 causes switch S11 to close, thereby connecting output 96 of catching amplifier 80 to output node 90. This closing of switch S11 causes a slight glitch in the output signal VOUT 124. After catching amplifier 80 is connected to output 90, the assertion of the signal Φ2 causes switch S12 to open, thereby disconnecting output 50 from output node 90 and from the catching amplifier. Since switch S11 is now closed, however, amplifier circuit 78 is maintained in a muting configuration. A slight glitch may appear in the output signal VOUT 124 when output 50 is disconnected from the circuit, as shown. At approximately the same time that the signal Φ2 is asserted, the signal Φ3 is deasserted (causing switch S13 to open), thereby removing the unity-gain feedback loop from main amplifier 40 and causing amplifier 40 to run open-loop. Thus, with switches S12 and S13 both being open, main amplifier 40 is configured as a comparator and may be used as such to calibrate the dc-offset voltage of main amplifier 40, as explained above in connection with the descriptions of circuits 36 (shown in FIG. 2), 76 (shown in FIGS. 3 and 4) and 21 (shown in FIG. 5). Meanwhile, the signal LOGIC ENABLE 122 is asserted so as to enable the up/down counter and/or associated logic to determine a proper (digitally represented) offset calibration level for the circuit.

Referring now to FIG. 9, in conjunction with FIG. 6, the previously discussed signals are depicted as they appear when circuit 78 exits its calibration cycle. First, the signal LOGIC ENABLE 122 is deasserted to disable the logic circuit and to permanently register the output of the up/down counter and/or related circuitry after calibration. Next, the signal Φ2 is deasserted and the signal Φ3 is asserted causing switches S12 and S13, respectively, to close. Thus, output 50 of main amplifier 40 is reconnected to circuit node 90 and main amplifier 40 is connected back into a unity gain configuration, i.e., a configuration having a gain of one between non-inverting input 54 and output 50 of main amplifier 40. A slight glitch appears in the signal VOUT 124 due to this reconnection. Meanwhile, after the signal LOGIC ENABLE 122 is deasserted, but before the signal Φ1 is deasserted, the signal SHORT 120 is asserted, causing the outputs of differential input transistors M1 and M2 (shown in FIG. 4) of main amplifier 40 to be shorted together. Next, just before the signal Φ1 is deasserted (causing the catching amplifier to be disconnected from output node 90) the signal SHORT 120 is deasserted (reopening switch S10). The signal Φ1 then is deasserted, causing switch S11 to open and disconnecting catching amplifier 80 from output node 90.

Since switch S13 is closed, however, amplifier circuit 78 remains in a muting configuration. Once again, a slight glitch occurs in the signal VOUT 124 due to the disconnection of catching amplifier 80. Now, after main amplifier 40 has its dc-offset voltage calibrated, the signal Φ3 may be deasserted and amplifier circuit 78 may resume normal operation as, for example, a gain or attenuation circuit.

FIG. 7 is another circuit 108 according to the invention. Circuit 108 is similar to circuit 78 except for the presence of main amplifier output stage 82 and catching amplifier output stage 84, and the configuration of the switches to service both stages of the amplifiers. Catching amplifier output stage 84 should be substantially identical to (i.e., sized proportionately to) main amplifier output stage 82, but can be, for example, two hundred times smaller than main amplifier output stage 82 to reduce the power consumption of the circuit. Potentiometer 24 (comprising resistor portions 24A and 24B) is connected between input node 28 and output node 90 of amplifier circuit 108 so as to allow the gain or attenuation of amplifier circuit 108 to be altered by adjusting the position of wiper 34. Switch S12 is connected between output 50 of main amplifier 40 and input 92 of main amplifier output stage 82. Switch S12 serves to disconnect output 50 from input 92 during a calibration cycle. Switch S14 is connected between input 52 of main amplifier 40 and output 94 of main amplifier output stage 82 to connect amplifier circuit 108 in a muting configuration when switch S14 is closed, i.e., to configure circuit 108 to have a gain of approximately zero between input node 28 and output node 90. Switch S11 in connected between input 98 of catching amplifier output stage 84 and input 92 of main amplifier output stage 82, and switch S15 is connected between output 88 of catching amplifier output stage 84 and output 94 of main amplifier output stage 82. Output 96 of catching amplifier 80 is connected to input 98 of catching amplifier output stage 84, a conductor is connected between inverting input 100 of catching amplifier 80 and output 88 of catching amplifier output stage 84, and non-inverting input 102 of catching amplifier 80 is connected to a constant voltage reference node, e.g., ground node GND. Since the two-stage catching amplifier is so configured, when switches S11 and S15 are closed and switch S12 is opened, amplifier circuit 108 will be held in a muting configuration by the two-stage catching amplifier.

As in circuit 78, the symbols Φ1, Φ2 and Φ3 beside the switches in amplifier circuit 108 represent signals that control the operation of the switches. These signals are shown in FIGS. 8 and 9, along with the other signals discussed in conjunction with FIG. 6. The operation of circuit 108 is nearly identical to that of circuit 78. First, switch S14 is closed responsive to the assertion of the signal Φ3, placing amplifier circuit 108 in a muting configuration. Next, the assertion of the signal Φ1 causes switches S11 and S15 to close, thereby engaging the catching amplifier. The signal Φ2 then is asserted (opening switch S12), the signal Φ3 is deasserted (opening switch S14), and the signal LOGIC ENABLE 122 is asserted. In this manner, the catching amplifier holds amplifier circuit 108 in a muting configuration as the main amplifier 40 is disengaged from the circuit, converted into a comparator, and calibrated. After the calibration sequence is complete, the signal LOGIC ENABLE 122 is deasserted, causing the final count of the up/down counter to be maintained at the output thereof. Just after the signal LOGIC ENABLE 122 is deasserted, the signal SHORT 120 is asserted (closing switch S10 in FIG. 4). Next, the signal Φ2 is deasserted (closing switch S12) and the signal Φ3 is asserted (closing switch S14), deconfiguring the main amplifier from its comparator mode. Finally, the signal SHORT 120 is deasserted (opening switch S10 in FIG. 4) just before the signal Φ1 is deasserted (opening switches S11 and S15), disconnecting the catching amplifier from the main amplifier. The signal Φ3 may subsequently be deasserted, allowing the main amplifier comprising main amplifier 40 and main amplifier output stage 82 to operate in a gain or attenuation configuration.

It should be understood that while the embodiments of the present invention described herein employ up/down counters to produce an increasing or decreasing digital signal, any logic circuitry producing a similar result may be used without departing from the scope of the invention. Also, the dc-offset of an amplifier may be calibrated with a finer or coarser resolution by using a counter with a greater or lesser number of bits and/or employing additional or fewer switches and trimming devices in the circuit. The size of the trimming devices also may be adjusted to suit a particular application. In addition, while the amplifier stages shown and described each comprise a single stage, each stage could likewise comprise several stages, also without departing from the scope of the invention.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier circuit, comprising:
   an amplifier element having a first input and a second input, the amplifier element being arranged to be configured as an amplifier during a period of normal operation and to be configured as a comparator during a calibration period of the amplifier element;
   a logic circuit coupled to an output of the amplifier element at least during the calibration period to receive an output signal from the output of the amplifier element and to output an offset compensation control signal representing an offset compensation voltage for the amplifier element; and
   an offset compensation circuit including:
      a positive voltage lead and a negative voltage lead, coupled, respectively, to the first input and the second input during the calibration period, and
      an offset compensation control lead coupled to the logic circuit to receive the offset compensation control signal from the logic circuit, the offset compensation circuit being configured to provide, responsive to the offset compensation control signal, only the offset compensation voltage between the positive voltage lead and the negative voltage lead of the offset compensation circuit during all times when the amplifier element is receiving power.

2. The amplifier circuit as claimed in claim 1, wherein the logic circuit is configured to provide a digital output signal which is altered in response to the output signal from the amplifier element such that, responsive to a clock signal, the offset compensation voltage is increased if the output signal from the amplifier element is in a first logic state and decreased if the output signal from the amplifier element is in a second logic state.

3. The amplifier circuit as claimed in claim 2, wherein:
   the logic circuit includes an up/down counter having an up/down select input and a count output, the output of the amplifier element being coupled to the up/down select input of the up/down counter at least during the calibration period; and
   the offset compensation circuit includes a digital-to-analog converter having a digital input coupled to the count output of the up/down counter to receive an output count of the up/down counter as the offset compensation control signal.

4. An amplifier circuit, comprising:
   an amplifier including:
      an input to receive an input signal,
      an output to provide an output signal, and
      a plurality of primary devices coupled between the input and the output;
   at least one secondary device, the at least one secondary device being substantially smaller than each of the plurality of primary devices; and
   at least one switch coupled to at least one of the amplifier and the at least one secondary device to selectively couple the at least one secondary device to the amplifier to alter the effective size of at least one of the plurality of primary devices to compensate for an offset voltage of the amplifier.

5. The amplifier circuit as claimed in claim 4, wherein the at least one of the plurality of primary devices is a transistor in a current mirror of the amplifier.

6. The amplifier circuit as claimed in claim 4, wherein the amplifier is connected to be configured as a comparator during a calibration period, and wherein the amplifier circuit further comprises a logic circuit coupled to the output of the amplifier at least during the calibration period to receive a logic signal from the output of the amplifier, and the logic circuit is coupled to the at least one switch to provide the at least one switch with a control signal which, responsive to the logic signal from the output of the amplifier, selectively activates the at least one switch.

7. The amplifier circuit as claimed in claim 6, wherein the logic circuit is configured such that the control signal includes a digital count that, responsive to a clock signal, is increased if the logic signal from the output of the amplifier is in a first logic state and is decreased if the logic signal from the output of the amplifier is in a second logic state.

8. The amplifier circuit as claimed in claim 4, wherein the plurality of primary devices includes a differential pair of the primary transistors and the amplifier further includes a shorting switch arranged to couple together a pair of outputs of the differential pair during a portion of the calibration period.

9. An amplifier circuit, comprising:
   an amplifier element arranged to be configured as an amplifier during a period of normal operation and to be configured as a comparator during a calibration period, the amplifier element including at least one device coupled to an internal node of the amplifier element, the at least one device having an operating parameter control lead to control an operating parameter of the at least one device;
   a logic circuit coupled to an output of the amplifier element at least during the calibration period to receive an output signal from the output of the amplifier element and to output an offset compensation control signal; and
   an offset compensation control circuit coupled to the logic circuit and to the operating parameter control lead of the at least one device to receive the offset compensation control signal from the logic circuit and provide a parameter control signal to the operating parameter control lead to control a particular operating parameter of the at least one device to compensate for an offset voltage of the amplifier element.

10. An amplifier circuit as claimed in claim 9, wherein the at least one device includes a transistor and the operating parameter control lead is coupled to a substrate biasing node of the transistor.

11. An amplifier circuit as claimed in claim 9, wherein the at least one device includes a transistor included in a differential pair of input transistors of the amplifier element.

12. An amplifier circuit, comprising:
 an amplifier connected to be configured as a comparator during a calibration period, the amplifier including:
  an input to receive an input signal,
  an output to provide an output signal, and
  at least one transistor included in a current mirror of the amplifier, the at least one transistor being coupled to an internal node of the amplifier and having an operating parameter control lead to control an operating parameter of the at least one transistor;
 a logic circuit coupled to the output of the amplifier at least during the calibration period to receive a signal from the output of the amplifier and to output an offset compensation control signal; and
 an offset compensation control circuit coupled to the logic circuit and to the operating parameter control lead of the at least one transistor to receive the offset compensation control signal from the logic circuit and provide a parameter control signal to the operating parameter control lead to control a particular operating parameter of the at least one transistor to compensate for an offset voltage of the amplifier.

13. An amplifier circuit as claimed in claim 9, wherein the logic circuit is configured such that the offset compensation control signal, responsive to a clock signal, is increased if the signal from the output of the amplifier element is in a first logic state and is decreased if the signal from the output of the amplifier element is in a second logic state.

14. An amplifier circuit, comprising:
 an amplifier element arranged to be configured as an amplifier during a period of normal operation and to be configured as a comparator during a calibration period;
 a logic circuit coupled to an output of the amplifier element at least during the calibration period to receive an output signal from the output of the amplifier element and to output an offset compensation control signal, the logic circuit being configured to, responsive to a clock signal, increase the offset compensation control signal if the signal from the output of the amplifier element is in a first logic state and decrease the offset compensation control signal if the signal from the output of the amplifier element is in a second logic state; and
 an offset compensation control circuit coupled to the logic circuit and the amplifier element to receive the offset compensation control signal from the logic circuit and, responsive to the offset compensation control signal, to compensate for an offset voltage of the amplifier element.

15. An amplifier circuit, comprising:
 means for detecting an offset voltage of an amplifier element during an offset calibration period in which the detecting means includes means for configuring the amplifier element as an amplifier during a period of normal operation and configuring the amplifier element as a comparator during a calibration period; and
 means for compensating for the offset voltage of the amplifier element, the compensating means being coupled to the detecting means at least during the calibration period.

16. A method for controlling an offset voltage of an amplifier element, comprising the steps of:
 configuring the amplifier element as a comparator during a calibration period;
 coupling a controllable voltage source that generates only an offset compensation voltage for the amplifier element between a pair of inputs of the amplifier element;
 responsive to an output of the amplifier element, generating an offset compensation control signal that controls the offset compensation voltage;
 responsive to the offset compensation control signal, adjusting the offset compensation voltage until the offset compensation voltage approximates an inherent offset voltage of the amplifier element; and
 configuring the amplifier element as an amplifier during a period of normal operation.

17. The method as claimed in claim 16, wherein the step of generating an offset compensation control signal responsive to the output of the amplifier element includes the steps of:
 responsive to a first logic state at the output of the amplifier element, increasing a value of the offset compensation control signal; and
 responsive to a second logic state at the output of the amplifier element, decreasing the value of the offset compensation control signal.

18. A method for compensating for an offset voltage of an amplifier including a primary device having a first size and at least one secondary device having a second size, the second size being substantially smaller than the first size, the method comprising the steps of:
 detecting an offset voltage of the amplifier; and
 responsive to a detected offset voltage, selectively coupling the at least one secondary device to an internal node of the amplifier such that the first size of the primary device is effectively increased or decreased by the second size of the secondary device so as to alter the offset voltage of the amplifier circuit.

19. The method as claimed in claim 18, wherein:
 the step of detecting the offset voltage of the amplifier includes the step of configuring the amplifier as a comparator; and
 the step of selectively coupling the at least one secondary device to the internal node of the amplifier responsive to the detected offset voltage includes the steps of:
  responsive to a first logic state at an output of the amplifier, increasing an offset compensation control signal which controls the selective coupling of the at least one secondary device to the amplifier circuit, and
  responsive to a second logic state at the output of the amplifier, decreasing the offset compensation control signal which controls the selective coupling of the at least one secondary device to the amplifier circuit.

20. A method for controlling an offset voltage of an amplifier element, comprising the steps of:
 configuring the amplifier element as a comparator during a calibration period;

connecting a pair of inputs of the amplifier element to one of a common node and two nodes having known voltages thereon;

responsive to an output signal of the amplifier element, selectively adjusting a level of an operating parameter of at least one device included in or coupled to the amplifier element to compensate for the offset voltage of the amplifier element; and configuring the amplifier element as an amplifier during a period of normal operation.

21. The method as claimed in claim 20, wherein the step of selectively adjusting the voltage of the operating parameter of the at least one device responsive to the output signal of the amplifier element includes the steps of:

responsive to a first logic state at the output of the amplifier element, increasing the level of the operating parameter of the at least one device; and responsive to a second logic state at the output of the amplifier element, decreasing the level of the operating parameter of the at least one device.

22. A method for compensating for an offset voltage of an amplifier element including the septs of:

configuring the amplifier element as a comparator during a calibration period;

connecting a pair of inputs of the amplifier element to one of a common node and two nodes having known voltages thereon; and responsive to a first logic state at an output of the amplifier element, increasing a value of the compensation signal that controls the offset compensation of the amplifier element;

responsive to a second logic state at the output of the amplifier element, decreasing the value of the compensation signal that controls the offset compensation of the amplifier element; and configuring the amplifier element as an amplifier during a period of normal operation.

23. The amplifier circuit as claimed in claim 9, wherein the offset compensation control circuit is configured such that the parameter control signal provided to the operating parameter control lead includes a parameter control voltage.

24. The amplifier circuit as claimed in claim 12, wherein the offset compensation control circuit is configured such that the parameter control signal provided to the operating parameter control lead includes a parameter control voltage.

25. The method of claim 20, wherein the step of selectively adjusting the level of the operating parameter of the at least one device includes selectively adjusting a voltage of the operating parameter of the at least one device.

* * * * *